United States Patent [19]
Tyler et al.

[11] Patent Number: 5,399,805
[45] Date of Patent: Mar. 21, 1995

[54] METAL ELECTRONIC PACKAGE WITH REDUCED SEAL WIDTH

[75] Inventors: Derek E. Tyler, Cheshire; Deepak Mahulikar, Madison; Anthony M. Pasqualoni, Hamden, all of Conn.; Jeffrey S. Braden, Milpitas; Paul R. Hoffman, Modesto, both of Calif.

[73] Assignee: Olin Corporation, New Haven, Conn.

[21] Appl. No.: 126,860

[22] Filed: Sep. 27, 1993

Related U.S. Application Data

[62] Division of Ser. No. 959,571, Oct. 13, 1992, Pat. No. 5,324,888.

[51] Int. Cl.6 .................... H01L 23/02; H01L 23/28; H05K 5/06
[52] U.S. Cl. ...................... 174/52.4; 174/52.2; 257/680; 257/682; 257/687; 257/787; 257/791
[58] Field of Search ............. 174/52.2, 52.4; 257/678, 680, 682, 690, 787, 788–794, 687, 692–696

[56] References Cited

U.S. PATENT DOCUMENTS

| | | |
|---|---|---|
| 4,079,511 | 3/1978 | Grabbe . |
| 4,709,301 | 11/1987 | Yamaguti . |
| 4,723,156 | 2/1988 | Okuaki . |
| 4,897,508 | 1/1990 | Mahulikar et al. . |
| 4,939,316 | 7/1990 | Mahulikar et al. . |
| 4,961,106 | 10/1990 | Butt et al. . |
| 4,965,227 | 10/1990 | Chang et al. . |
| 5,019,892 | 5/1991 | Grabbe . |
| 5,023,398 | 6/1991 | Mahulikar et al. . |
| 5,060,114 | 10/1991 | Feinberg et al. . |
| 5,066,368 | 11/1991 | Pasqualoni et al. . |

FOREIGN PATENT DOCUMENTS

56-37656 11/1981 Japan .
62-145748 12/1985 Japan .

OTHER PUBLICATIONS

Herman S. Hoffman, Leslie Griffiths, Guy Monti and Bhola Singh "Metal Package for a High-Power Microprocessor Chip" appearing in Advances in Electronic Packaging, ASME (1992) at pp. 23–26. (No month provided).

C. P. Wong, John M. Segelken, John W. Balde "Understanding the Use of Silicon Gels for Nonhermetic Plastic Packaging" appearing in IEEE Transactions on Components, Hybrids, and Manufacturing Technology, Dec. 1989, vol. 12, No. 4, (ISSN 0148-6411) at pp. 421–425.

John W. Balde "The IEEE Gel Task Force—An Early Look at the Final Testing" appearing in IEEE Transactions on Components, Hybrids, and Manufacturing Technology, vol. 12, No. 4, (Dec. 1989) at pp. 426–429.

Kent Adams, "Applications for Sealants" appearing in Adhesives and Sealants. Engineered Materials Handbook. vol. 3. (1990) at pp. 604–612. (no month provided).

Primary Examiner—Bot LeDynh
Attorney, Agent, or Firm—Gregory S. Rosenblatt

[57] ABSTRACT

There is provided an electronic package where the package components define a cavity. A semiconductor device and a portion of a leadframe occupy part of the cavity. Substantially the remainder of the cavity is filled with a compliant polymer, such as a silicone gel. Since the cavity is no longer susceptible to gross leak failure, the seal width of adhesives used to assemble the package may be reduced, thereby increasing the area available for mounting the semiconductor device.

19 Claims, 2 Drawing Sheets

METAL ELECTRONIC PACKAGE WITH REDUCED SEAL WIDTH

This application is a division of application Ser. No. 07/959,571, filed Oct. 13, 1992, now U.S. Pat. No. 5,324,888.

FIELD OF THE INVENTION

This invention relates to an electronic package for housing at least one semiconductor device. More particularly, by filling the package cavity with a compliant polymer the seal width of an adhesive sealant is reduced.

BACKGROUND OF THE INVENTION

Integrated circuit devices, such as silicon based semiconductor circuits, are encased within a package to protect the device from mechanical shock. The packages are manufactured from a variety of materials, such as plastics, ceramics and metals.

U.S. Pat. No. 4,939,316 to Mahulikar et al discloses a metallic package. The patent, which is incorporated by reference in its entirety herein, discloses an anodized aluminum alloy base and cover defining a cavity. A leadframe is disposed between the base and cover and bonded to both by an adhesive seal ring. An integrated circuit device is electrically interconnected to the leadframe and encased within the cavity. The assembled package is light weight, durable and efficiently dissipates heat generated by the device.

The aluminum alloy package components have a coefficient of thermal expansion significantly lower than the adhesive sealants, typically an epoxy, used to seal the package. When the packages are heated, thermally generated mechanical stresses can cause delamination between the leadframe and the adhesive. As the packages are heated or cooled, air trapped within the package cavity expands and contracts. The cavity has a fixed volume so the expansion and contraction of the trapped air is compensated as changes in air pressure. The pressure changes apply a stress on the seal ring which could eventually lead to delamination.

Seal ring delamination results in a gross leak failure. One way to identify gross leak failure is by immersing the package in an inert liquid fluorocarbon heated to 125° C. typically for about 1 minute. A stream of bubbles emanating from the package indicates seal delamination and a passageway to the package cavity. Water vapor and other contaminants can enter the package cavity leading to corrosion of the device or electric circuitry.

One method to prevent seal delamination is to increase the width of the seal path. This solution is contrary to a primary electronic package manufacturing objective, namely to maximize the area available within the package cavity for housing the electronic device. One continuing goal of electronic packaging is to encapsulate the largest device possible within a given package outline.

As discussed below, Applicants increase the area available for the semiconductor device by filling the package cavity with a compliant polymer, such as a silicone gel. In U.S. Pat. No. 4,961,106 to Butt et al a package cavity is filled with a fluid or gel having good thermal conductivity, such as helium or hydrogen gas and silicone or silicate gels.

U.S. Pat. No. 5,060,114 to Feinberg et al discloses a conformable gel pad inserted within the cavity of a package. The gel pad has a compressible matrix made from silicone or polyurethane with a thermally conductive material dispersed throughout.

"Glop topping" is utilized in molded plastic packages as disclosed in U.S. Pat. No. 4,965,227 to Chang et al. The package cavity is filled with a soft gel, for example silicone, to provide environmental protection. The glop top is used in molded packages because the molding resin is permeable to moisture. The glop top prevents corrosion of package components by inhibiting moisture diffusion.

While the addition of a compliant polymer to a package cavity has been disclosed for improving thermal conductivity and for providing a moisture barrier, compliant polymers have not, until now, been used to reduce the seal path width thereby increasing the size of the electronic device which can be encapsulated within a fixed package outline.

SUMMARY OF THE INVENTION

Accordingly, it is an object of the invention to provide an electronic package having an adhesive seal ring with a reduced width. It is a feature of the invention that the package cavity is filled with a compliant polymer to prevent the ingress of contaminants. It is a benefit of the invention that larger integrated circuit devices or multiple devices can be housed within a fixed package outline. It is a further benefit of the invention that the cavity is essentially contaminant free, facilitating the use of aluminum based bond wires rather than gold based bond wires. By filling the package cavity with a gel, the bond wires are held firmly in place. The bond wires do not move during mechanical shock or vibration reducing the chance of adjacent wires touching and creating an electrical short circuit. Also, vibration of the bond wires can cause the wire to work harden, become brittle and break.

Yet another benefit of the invention is that thermoplastic polymer sealants may be used in addition to thermosetting adhesives to assemble the package. By sealing the package lid with a thermoplastic adhesive, a sealed package may be subsequently opened for replacement or repair. As another benefit of the invention, the compliant gel may be selected to be ultraviolet light transparent and the package sealed with a UV transmitting glass lid for a package to house an erasable-programable (EPROM) device.

In accordance with the invention there is provided an adhesively sealed electronic package. The package has a base and a cover defining a cavity. A leadframe electrically interconnected to an integrated circuit device is disposed between the base and cover with the device and a portion of the leadframe positioned within the cavity. A compliant polymer fills substantially the remainder of the cavity. An adhesive having a reduced seal width bonds the leadframe to both the base and to the cover.

The objects, features and benefits described above will become more apparent from the specification and drawings which follow.

IN THE DRAWINGS

DETAILED DESCRIPTION OF THE INVENTION

Figure 1:
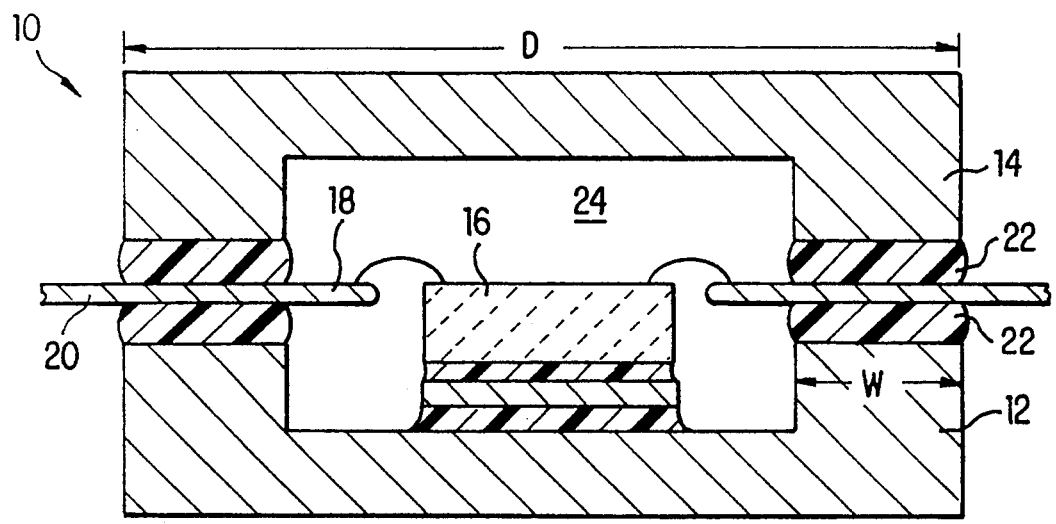
FIG. 1 shows in cross sectional representation an adhesively sealed metal package as known from the prior art.

FIG. 1 shows in cross sectional representation a metal electronic package 10 as known from the prior art. The package 10 has a metallic base 12 and a cover 14. The cover 14 is typically formed from the same material as the base 12. To maximize thermal conductivity and minimize package weight, the base 12 and cover 14 can be manufactured from aluminum or an aluminum alloy. One suitable aluminum alloy is designated by the American Society of Metals (ASM) as A3003 and has the nominal composition by weight of 0.12% copper, 1.2% manganese and the balance aluminum. A3003 can be imparted with a black color by integral color anodization as disclosed in U.S. Pat. No. 5,066,368 to Pasqualoni et al.

An electronic device 16 is electrically interconnected to the inner leads 18 of a leadframe 20. An adhesive 22 bonds the leadframe 20 to both the base 12 and to the cover 14. Tenacious adhesion between the adhesive 22 and the other package components is required to withstand the stresses generated by the coefficient of thermal expansion mismatch between the package components and the adhesive as well as by variations in the pressure of the air trapped within the package cavity 24. To prevent gross leak failures, the adhesive is selected to be a strongly adherent thermosetting polymer such as an epoxy.

The peripheral dimension of the package 10, designated "D", is dictated by the available space on a printed circuit board (not shown). This space is limited and due to the trend in the electronics industry for standardization, "D" is usually fixed. The maximum size of the device 16 is limited by the size of the cavity 24. The only way to increase the size of the cavity 24 is to reduce the seal width, designated "W". However, when "W" is reduced below a critical value, the mechanical stress on the adhesive induced by the combination of thermal expansion mismatch and the cavity pressure variations causes seal delamination. When the base 12 and cover 14 are an aluminum alloy, the leadframe unplated copper and the sealant a novalac based epoxy, this critical value is about 3.8 mm (0.15 inches).

Figure 2:
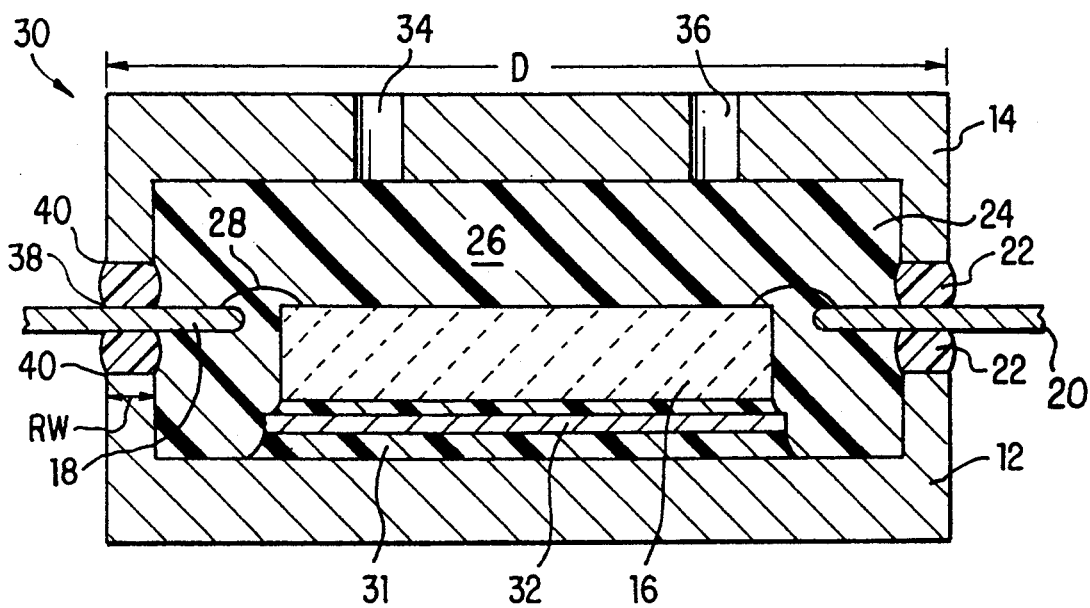
FIG. 2 shows in cross sectional representation an adhesively sealed metal package in accordance with a first embodiment of the invention.

FIG. 2 illustrates in cross sectional representation an electronic package 30 in accordance with the invention. The package 30 has a base 12 and a cover 14. While both the base 12 and the cover 14 may be manufactured from any suitable material, such as a plastic, ceramic, metal or composite, metals are preferred. Aluminum and aluminum alloys are most preferred due to the low weight and good thermal conductivity of the metals. Portions of the base 12 and cover 14 may be anodized to increase corrosion resistance and to improve adhesion to the adhesive 22. It is most preferred that the base 12 and cover 14 be formed from aluminum alloys of the ASM 3xxx and 6xxx series. 3xxx series aluminum alloys contain up to about 1.5% by weight manganese along with other alloying elements while 6xxx alloys contain magnesium and silicon in an approximate proportion to form $Mg_2Si$. Both alloy series are capable of forming a gray to black color by integral color anodization.

The package 50 has a reduced seal width designated "RW". As used throughout the specification and claims herein, "RW", or reduced seal width, means a seal ring width less than the critical value. The seal ring width is less than the width required to prevent thermally induced and pressure variation induced adhesive delamination in a package having an unfilled cavity. Since the peripheral dimension "D" does not change, reducing the seal width "RW" increases the area of the cavity 24. The mechanism by which "W" may be decreased to "RW" is by filling the cavity 24 with a compliant polymer 26.

Disposed between the base 12 and cover 14 is a leadframe 20. The leadframe is usually manufactured from copper or a copper alloy to maximize electrical conductivity. An integrated circuit device 16 is electrically interconnected to inner lead portions 18 of the leadframe 20. Electrical interconnection may be by means of thin bond wires 28 or thin copper foil strips (not shown) as used in tape automated bonding (TAB). The thin bond wires may be manufactured from any suitable metal such as gold, aluminum, copper or alloys thereof. The bond wires are protected from environmental corrosion by the compliant polymer 26 so it is not necessary to use expensive gold based bond wires. Similarly, it is not necessary to coat the TAB leads with gold or another barrier layer when the compliant polymer 26 is utilized.

The reliability of the bond wires 28 is further protected by the compliant polymer 26 by being held rigidly in place. The bond wires do not move due to mechanical shock or vibration. Movement of the wires may cause two bond wires to touch creating an electrical short circuit. Vibration can work harden a wire causing the wire to become brittle and break. The compliant polymer yields when stressed so there is not problem of bond wire breakage due to coefficient of thermal expansion mismatch as occurs in molded plastic packages such as PDIPs (plastic dual in line packages) and PQFPs (plastic quad flat packages).

The integrated circuit device 16 may be free floating within the cavity 24 or bonded to the package base 12 by a compliant adhesive 31. For ease of assembly, the integrated circuit device 16 is usually bonded to a die attach paddle 32. That portion of leadframe 20 which includes the inner leads 18 and die attach paddle 32 as well as the semiconductor device 16 occupy a portion of the cavity 24. The adhesive 22 bonds the leadframe 20 to both the base 12 and cavity 24.

Substantially the remainder of the cavity 24 is occupied by the compliant polymer 26. The compliant polymer 26 may be any suitable material such as a viscous liquid, a gel or a compliant plastic. Gelatinizable materials which are introduced into the cavity 24 in liquid form and subsequently coagulated into a gelatinous solid are preferred. While in the liquid phase, the gelatinizable compliant polymer 26 should have a sufficiently low viscosity to fill all corners and hidden features of the cavity 24. After coagulating to a gel, the viscosity should be sufficiently high to avoid cavity leakage through the seal ring. The coagulated gel should further be chemically inert with respect to the leadframe 20, integrated circuit device 16 and bond wires 28. Ideally, the compliant material 26 should have good thermal conductivity to aid in the removal of heat from the integrated circuit device 16. However, in metallic packages good thermal conductivity is not critical because most thermal dissipation is through the base 12.

Preferred compliant polymers include liquids, gels and plastics such as gelatinizable silicones, fluorocarbons and epoxies. A most preferred polymer is a gelatinazable silicone manufactured by Dow Corning, Midland, Mich.

The compliant polymer while in the liquid phase is introduced to the cavity 24 through first vent port 34 by any suitable means such as a large diameter hypodermic needle. Sufficient compliant polymer is introduced to the cavity 24 such that substantially the entire cavity is filled. To remove air displaced from the cavity 24, a second vent port 36 is provided. The compliant polymer is added until there is sufficient compliant polymer that both the first 34 and second 36 vent ports are at least partially filled. The compliant polymer, if gelatinizable, is coagulated into a gel and the vent ports sealed.

Once the cavity 24 is filled with the gel, seal ring delamination is not a problem. Delamination is less likely because the air in the package has been displaced. The pressure variation induced stress on the adhesive 22 during package heating and cooling has been eliminated. Beneficially, should a portion of the adhesive 22 delaminate, the result is not a gross leak failure. The flow of contaminants into the package cavity 24 is inhibited by the compliant polymer 26. Contaminants are unable to reach bond wires 28 or semiconductor device 16.

One additional benefit realized is that because the bond wires 28 are fully protected from chlorides and other contaminants, aluminum or aluminum alloy bond wires may be utilized rather than the more chemically inert, but much more costly gold or gold alloys.

A second additional benefit which is realized is that the adhesive strength of the adhesive 22 is less critical. When the package cavity is not filled, or only partially filled, any delamination of the polymer 22 leads to a gross leak failure. When the package cavity 24 is substantially filled, in accordance with the invention, delamination can be tolerated. The primary function of the adhesive 22 changes from maintaining package hermeticity to merely holding the package components together. As a result, rather than a tenacious adhesive such as an epoxy being required, less tenacious adhesives such as thermoplastic polymer may be utilized.

Suitable thermoplastic polymers include those commonly referred to as "Hot-Melt" Adhesives. These adhesives, with the addition of suitable fillers, will remain solid up to about 175° C. and can withstand momentary exposure to higher temperatures the package may achieve during soldering to a printed circuit board. As the temperature is increased above the melting temperature, the adhesives rapidly melt to a low viscosity fluid which rapidly sets when the temperature is lowered again. Because the adhesives are thermoplastic, the melting/resolidification process is repeatable. Hot melt adhesives include ethylene and vinyl acetate copolymers (EVA), polyvinyl acetate (PVA), polyethylene, amorphous polypropylene, block copolymers such as those based on styrene and elastomeric segments or ether and amide segments (i.e. thermoplastic elastomers), polyamides and polyesters. EVA is one preferred hot melt adhesive.

A primary advantage of using a thermoplastic polymer as the adhesive 22 is that the package can be reopened after sealing to perform device repair or replacement. Repair is not possible with a thermosetting polymer such as an epoxy.

Figure 3:
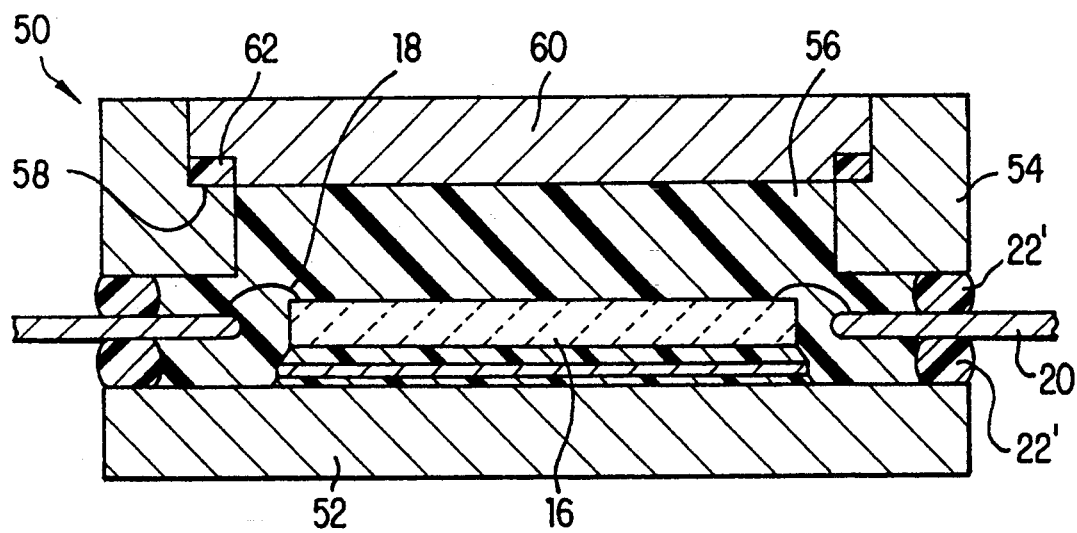
FIG. 3 shows in cross sectional representation an adhesively sealed window frame package in accordance with a second embodiment of the invention.

FIG. 3 illustrates in cross sectional representation a window frame package 50 in accordance with the invention. The package has a base which may be a metal plate 52, optionally containing a depressed central region for receiving the semiconductor device. The metallic plate 52 may be manufactured from any suitable material and is preferably metallic, and most preferably aluminum or an aluminum alloy. The leadframe 20 with an electrically interconnected semiconductor device 16 is disposed between the metallic plate 52 and a window frame 54. A first adhesive 22 bonds the leadframe 20 to both metallic plate 52 and the window frame 54. The window frame 54 is manufactured from a suitable material, such as plastic, metal or ceramic. Preferably, the window frame 54 has a coefficient of thermal expansion about equal to that of metallic plate 52. Most preferably, the window frame 54 is manufactured from the same material as the metallic base plate 52.

After bonding the leadframe and electrically interconnecting the semiconductor device 16, the metallic plate 52 and window frame 54 define a cavity 56. The cavity 56 is filled with a compliant polymer 26 up to the sealing surface 58 of the window frame 54. Because the center of the window frame 54 is a large aperture, introduction of the compliant material may be by any suitable means such as injection from a small diameter tube. After the compliant polymer coagulates to a gel, a cover 60 is bonded to the seal surface 58 by a second adhesive 62. The second adhesive 62 is any suitable material such as a thermosetting polymer, a thermoplastic polymer or a solder. A thermoplastic polymer such as the hot melt adhesives (i.e. EVA) is preferred so that the cover 60 is removable. The cover 60 may be any suitable material such as a plastic, glass, ceramic or metal. To prevent thermally induced flexure of the package, in one preferred embodiment, the cover 60 is manufactured from the same material as the metallic plate 52.

In a second embodiment of the invention, the cover 60 is selected to be a glass capable of transmitting a certain wavelength of electromagnetic radiation. Exposure of certain devices to electromagnetic radiation erases the device memory, these devices are commonly referred to as EPROM devices. A preferred cover would be capable of transmitting ultraviolet (UV) light. One UV transparent cover is quartz (silicon dioxide). The selected compliant polymer should also be transparent to UV radiation. This package is superior to other EPROM packages. By filling the package cavity with the compliant polymer, changes in temperature and the corresponding pressure changes will not flex the glass cover which may distort the UV light path. The cover can be sealed with a thermoplastic adhesive permitting replacement in the event the glass is scratched.

The window frame package 50 of FIG. 3 can encapsulate a larger semiconductor device 16 or a plurality of devices within a fixed package profile than was possible with prior art packages. The coagulated compliant polymer mitigates the destructive effect of delamination. The bond wires 28 may be manufactured from a less inert material than gold and the cover 14 may be sealed with a removable second adhesive 62 such as a thermosetting polymer.

The advantage of the electronic package of the invention will become more apparent from the Example which follows. The Example is intended to be exemplary and not limiting.

EXAMPLE

A series of metal electronic package were assembled with a novalac based epoxy film seal ring of a width as specified in Table 1. The packages had 28 mm×28 mm (1.1 inch×1.1 inch) anodized aluminum base and cover components sealed to a 208 lead copper lead frame. The assembled packages were placed in a pressure cooker at 121° C., 100% relative humidity for 200 hours and then tested for gross leaks. As shown in Table 1, the packages had a critical value of about 3.8 mm (0.150 inches).

TABLE

| Seal Ring Width | Gross leak Results Failures/Parts Tested |
| --- | --- |
| 1.27 mm (.050 in.) | 8/8 |
| 1.91 mm (.075 in.) | 7/8 |
| 2.54 mm (.100 in.) | 8/8 |
| 3.18 mm (.125 in.) | 6/8 |
| 3.81 mm (.150 in.) | 0/8 |

By filling the package cavity with the compliant polymer in accordance with the invention, gross leak failures were eliminated permitting the assembly of packages with a seal ring width of less than 2.54 mm.

To illustrate the advantage of reducing the seal ring width, the portion of the exemplary bases (unfilled cavity), seal ring dimensions (28 mm×3.81 mm Outside dimension; 20.4 mm×3.81 mm Inside dimension) available for mounting a semiconductor device is:

Area of Base Area of Seal Ring=Available Area $$784 \text{ mm}^2 - 369 \text{ mm}^2 = 415 \text{ mm}^2 \qquad (1)$$

By filling the cavity with a compliant polymer in accordance with the invention, the adhesive seal width can be reduced to below about 2.54 mm and more preferably to the range of about 1.25 mm to about 2.0 mm. At the upper end of the preferred range, seal width of 2.0 mm, the area available for mounting the semiconductor device is:

$$784 \text{ mm}^2 - 246 \text{ mm}^2 = 538 \text{ mm}^2 \qquad (2)$$

an increase of 123 mm² or about 30% more area available for mounting the semiconductor device.

The patents set forth in this application are incorporated by reference herein.

It is apparent that there has been provided in accordance with this invention an adhesively sealed electronic package having a reduced seal ring width which fully satisfies the objects, means and advantages set forth herein above. While the invention has been described in combination with the embodiments thereof. It is evident that many alternatives, modifications and variations will be apparent to those skilled in the art in light of the foregoing description. Accordingly, it is intended to embrace all such alternatives, modifications and variations as fall within the spirit and broad scope of the appended claims.

We claim:

1. An electronic package, comprising:
   a base and a cover defining a cavity and a peripheral dimension of said electronic package;
   a leadframe disposed between said base and said cover;
   an adhesive having a reduced seal width bonding said leadframe both to said base and to said cover thereby providing an increased area cavity;
   a semiconductor device electrically interconnected to said leadframe, wherein said semiconductor device and a portion of said leadframe occupy a portion of said cavity; and
   a compliant polymer occupying substantially the remainder of said cavity.

2. The electronic package of claim 1 wherein said compliant polymer is selected from the group consisting of viscous liquids, gels and compliant plastics.

3. The electronic package of claim 2 wherein said compliant polymer is a gel.

4. The electronic package of claim 3 wherein said compliant polymer is a silicone gel.

5. The electronic package of claim 2 wherein said adhesive is selected from the group consisting of thermosetting polymers and thermoplastic polymers.

6. The electronic package of claim 5 wherein said adhesive is a thermoplastic polymer.

7. The electronic package of claim 6 wherein said base and cover are metallic.

8. The electronic package of claim 7 wherein said base and cover are anodized aluminum.

9. The electronic package of claim 8 wherein said compliant polymer is a gel.

10. The electronic package of claim 6 wherein said cover is a glass transparent to a desired electromagnetic radiation.

11. The electronic package of claim 10 wherein said base is anodized aluminum and said cover is silicon dioxide.

12. An electronic package, comprising:
    a base and a cover defining a cavity and a peripheral dimension of said electronic package;
    a leadframe disposed between said base and said cover and bonded to both;
    a first adhesive having a reduced seal width bonding said leadframe both to said base and to said cover thereby providing an increased area cavity;
    a thermoplastic second adhesive bonding said leadframe to said cover;
    a semiconductor device electrically interconnected to said leadframe, wherein said semiconductor device and a portion said leadframe occupy a portion of said cavity; and
    a compliant polymer occupying substantially the remainder of the cavity.

13. The electronic package of claim 12 wherein said compliant polymer is selected from the group consisting of viscous liquids, gels and compliant plastics.

14. The electronic package of claim 13 wherein said compliant polymer is a gel.

15. The electronic package of claim 14 wherein said compliant polymer is a silicone gel.

16. The electronic package of claim 15 wherein said first adhesive is selected from the group consisting of thermosetting polymers and thermoplastic polymers.

17. The electronic package of claim 13 wherein said base and cover are anodized aluminum.

18. The electronic package of claim 13 wherein said cover is a glass transparent to a desired electromagnetic radiation.

19. The electronic package of claim 18 wherein said base is anodized aluminum and said cover is silicon dioxide.

* * * * *